United States Patent
Mershon et al.

(10) Patent No.: US 7,630,601 B2
(45) Date of Patent: Dec. 8, 2009

(54) CONNECTING A COMPONENT WITH AN EMBEDDED OPTICAL FIBER

(75) Inventors: Jayne L. Mershon, Corbett, OR (US); William O. Alger, Portland, OR (US); Gary A. Brist, Yamhill, OR (US); Gary B. Long, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/072,608

(22) Filed: Feb. 26, 2008

(65) Prior Publication Data

US 2008/0159689 A1  Jul. 3, 2008

Related U.S. Application Data

(60) Division of application No. 11/468,244, filed on Aug. 29, 2006, now Pat. No. 7,373,068, which is a continuation of application No. 10/668,511, filed on Sep. 22, 2003, now abandoned.

(51) Int. Cl.
  G02B 6/34 (2006.01)
  G02B 6/26 (2006.01)
  G02B 6/42 (2006.01)
(52) U.S. Cl. .............. 385/36; 385/31; 385/39; 385/47; 385/50; 438/29; 438/31
(58) Field of Classification Search ............ 385/36, 385/47
  See application file for complete search history.

(56) References Cited

U.S. PATENT DOCUMENTS

| 3,508,589 | A |   | 4/1970 | Berton et al. |
|---|---|---|---|---|
| 4,234,907 | A |   | 11/1980 | Daniel |
| 4,732,446 | A | * | 3/1988 | Gipson et al. ............ 385/24 |
| 4,761,047 | A |   | 8/1988 | Mori |
| 4,772,092 | A |   | 9/1988 | Hofer et al. |
| 4,885,663 | A |   | 12/1989 | Parker |
| 5,021,928 | A |   | 6/1991 | Daniel |
| 5,183,323 | A |   | 2/1993 | Daniel |
| 5,249,105 | A |   | 9/1993 | Koizumi |
| 5,256,468 | A |   | 10/1993 | Wiener |
| 5,280,558 | A |   | 1/1994 | Wiener |
| 5,469,895 | A |   | 11/1995 | Wiener |
| 5,524,679 | A | * | 6/1996 | Wiener ............ 139/420 R |

(Continued)

FOREIGN PATENT DOCUMENTS

EP  0272027 A2  6/1988

(Continued)

OTHER PUBLICATIONS

KIPO, Notice of Preliminary Rejection, Korean Application No. 10-2006-7005569, mailed Jan. 3, 2008, 4 pgs.

(Continued)

*Primary Examiner*—Ryan Lepisto
(74) *Attorney, Agent, or Firm*—Michael D. Plimier; Intel Corporation

(57) ABSTRACT

The invention provides an optical connection between a component on a printed circuit board ("PCB") and an optical fiber embedded in the PCB. By optically connecting the component with the optical fiber, the component may use the optical fiber for high speed optical data communication.

17 Claims, 13 Drawing Sheets

U.S. PATENT DOCUMENTS

| | | | |
|---|---|---|---|
| 5,568,964 | A | 10/1996 | Parker et al. |
| 5,581,403 | A | 12/1996 | Petrisko et al. |
| 5,600,741 | A * | 2/1997 | Hauer et al. ............... 385/35 |
| 5,851,403 | A | 12/1998 | Petrisko et al. |
| 5,898,803 | A * | 4/1999 | Mueller-Fiedler et al. ..... 385/36 |
| 6,072,619 | A | 6/2000 | Kiryuschev et al. |
| 6,257,771 | B1 * | 7/2001 | Okayasu ................... 385/89 |
| 6,304,700 | B1 | 10/2001 | Brand et al. |
| 6,324,313 | B1 * | 11/2001 | Allman et al. ............... 385/14 |
| 6,330,377 | B1 * | 12/2001 | Kosemura ................... 385/14 |
| 6,510,267 | B1 * | 1/2003 | Hulse et al. ................. 385/50 |
| 6,757,176 | B1 * | 6/2004 | Jiang et al. ................. 361/784 |
| 6,851,844 | B2 | 2/2005 | Guy |
| 6,882,762 | B2 | 4/2005 | Brist et al. |
| 2002/0039475 | A1 * | 4/2002 | Furuyama ................... 385/129 |
| 2002/0141163 | A1 | 10/2002 | Parker et al. |
| 2004/0042705 | A1 * | 3/2004 | Uchida et al. ................ 385/14 |
| 2004/0091211 | A1 * | 5/2004 | Umebayshi et al. ........... 385/49 |
| 2004/0101259 | A1 * | 5/2004 | Kilian ....................... 385/93 |
| 2004/0109628 | A1 | 6/2004 | Kim et al. |
| 2005/0063637 | A1 | 3/2005 | Mershon et al. |

FOREIGN PATENT DOCUMENTS

| | | |
|---|---|---|
| JP | 63-161413 | 7/1988 |
| WO | 0231561 A1 | 4/2002 |
| WO | WO-02-31563 | 4/2002 |

OTHER PUBLICATIONS

KIPO, Second Notice of Preliminary Rejection, Korean Application No. 10-2006-7005569, mailed Jun. 13, 2007, 13 pgs.

EPO, Office Action, European Patent Application No. 04784437.8, mailed Jul. 21, 2006, 3 pgs.

EPO, Office Action, European Patent Application No. 04784437.8, mailed Aug. 5, 2008, 3 pgs.

MYIPO, Office Action, Malaysian Patent Application No. PI 20043376, mailed Feb. 13, 2008, 2 pgs.

PCT, Search Report and Written Opinion, International Application No. PCT/US2004/030575, mailed Jan. 3, 2005, 14 pgs.

IPOS, Written Opinion, Singapore Patent Application No. 200601344-5, mailed Dec. 6, 2007, 4 pgs.

USPTO, Office Action, U.S. Appl. No. 10/668,511, mailed Jun. 3, 2005, 14 pgs.

USPTO, Notice of Allowability, U.S. Appl. No. 10/668,511, mailed Jun. 15, 2006, 9 pgs.

USPTO, Office Action, U.S. Appl. No. 11/468,244, mailed Jul. 27, 2007, 11 pgs.

USPTO, Notice of Allowance, U.S. Appl. No. 11/468,244, mailed Jan. 2, 2008, 5 pgs.

* cited by examiner

CONNECTING A COMPONENT WITH AN EMBEDDED OPTICAL FIBER

This is a Divisional Application of Ser. No. 11/468,244 filed Aug. 29, 2006 now U.S. Pat. No. 7,373,068, which is a Continuation Application of Ser. No. 10/668,511 filed Sep. 22, 2003 now abandoned.

BACKGROUND

1. Field of the Invention

This invention relates to printed circuit boards, and more particularly to use of optical fibers in printed circuit boards for communication.

2. Background of the Invention

A printed circuit board ("PCB") is a structure to which electronic devices are attached. The PCB has one or more structural layers as well as patterned conductors. The structural layers support the electronic devices while the conductors provide power to the electronic devices and allow devices to communicate through use of electronic signals.

FIG. 1 is a cross-sectional side view of a portion of a typical conventional PCB 100. The illustrated conventional PCB 100 has a structural core 102. This structural core 102 provides a rigid support to which other parts of the PCB 100 may be applied or electronic devices may be attached. The structural core 102 in this case has four core structural layers 104, 106, 108, 110. These core structural layers 104, 106, 108, 110 are each a fiberglass/resin composite material. The core structural layers 104, 106, 108, 110 have been pressed together and cured to form the structural core 102.

Above the top core structural layer 104 is a first top layer of conductive traces 112. These conductive traces 112 provide electronic connections to electronic devices that will be attached to the PCB 100. The conductive traces 112 may provide power or ground, or may allow electronic devices to communicate through use of electronic signals conducted by the traces 112. The first layer of conductive traces 112 is covered by a structural layer 114. This structural layer 114 is applied on top of the first layer of conductive traces 112 and cured. This process allows the structural layer 114 to fill in gaps between the traces 112 and adhere to the top layer 104 of the core 102 as well as to the traces 112 themselves. On top of the structural layer 114 is a second top layer of conductive traces 116. These traces 116 may also provide power or ground, or may allow electronic devices to communicate. The structural layer 114 separates the first and second top layers of conductive traces 112, 116, and insulates the traces 112, 116 from each other.

Similarly, below the bottom core structural layer 110 is a first bottom layer of conductive traces 118, a structural layer 120, and a second bottom layer of conductive traces 122. Like the top layers of conductive traces 112, 116, the bottom layers of conductive traces 118, 120 may provide power or ground, or may allow electronic devices to communicate. The structural layer 120 separates the first and second bottom layers of conductive traces 118, 120, and insulates the traces 118, 120 from each other.

As modern electronic devices increase in complexity, speed, and capabilities, their requirements for communication capacity also has risen. Such modern devices may require more communication capacity than can be provided by even PCBs 100 with multiple layers of conductive traces 112, 116, 118, 120, such as the PCB 100 shown in FIG. 1.

DETAILED DESCRIPTION

In the following detailed description of embodiments of the invention, reference is made to the accompanying drawings in which like references indicate similar elements. The illustrative embodiments described herein are disclosed in sufficient detail to enable those skilled in the art to practice the invention. The following detailed description is therefore not to be taken in a limiting sense, and the scope of the invention is defined only by the appended claims.

System Overview

Figure 1:
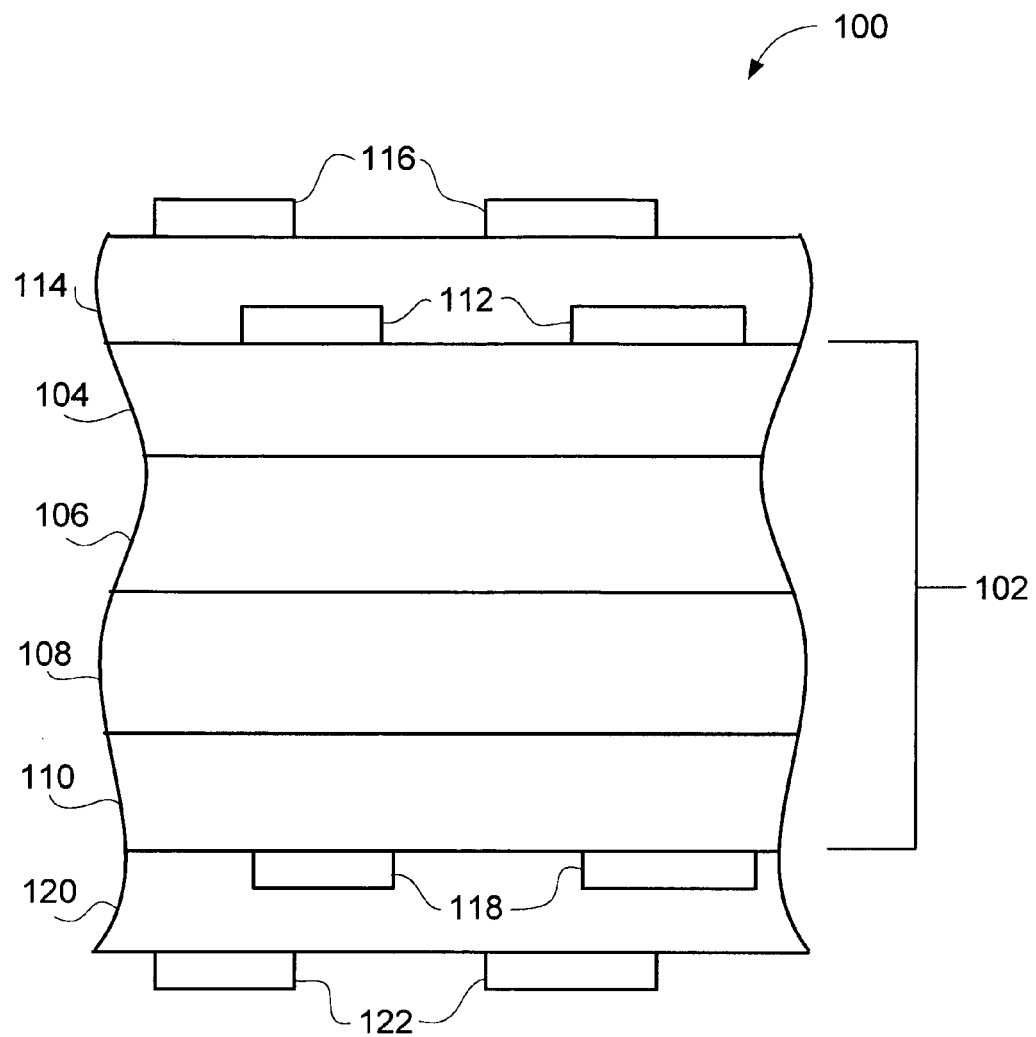
FIG. 1 is a cross-sectional side view of a portion of a typical conventional printed circuit board ("PCB").
Figure 2:
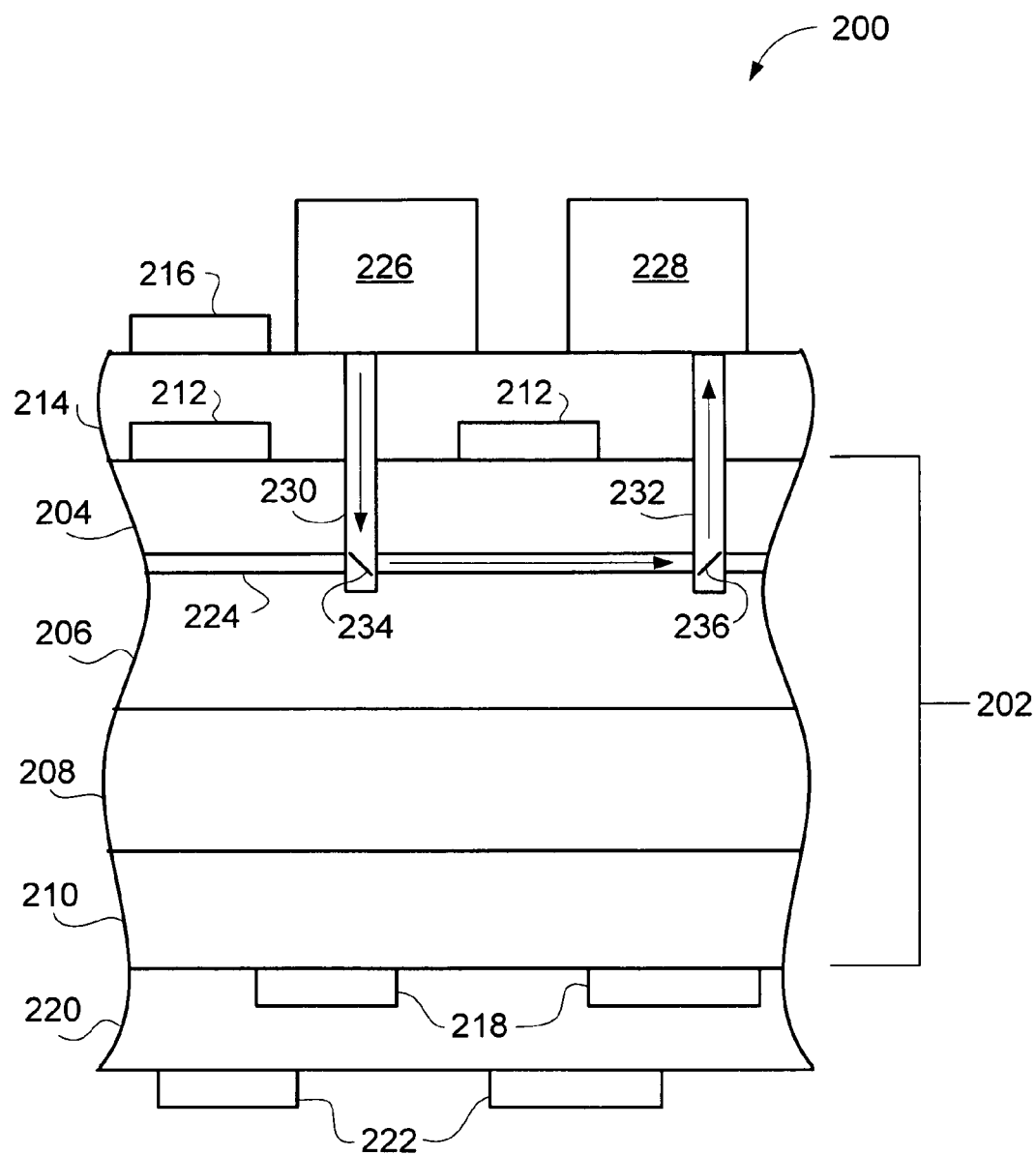
FIG. 2 is a cross-sectional side view of a system according to one embodiment of the present invention.

FIG. 2 is a cross-sectional side view of a portion of a system according to one embodiment of the present invention where devices 226, 228 or other devices attached to a printed circuit board ("PCB") 200 communicate via optical fibers 224 integrated with the PCB 200. By allowing optical communication, the system with the PCB 200 allows much higher data communication rates than prior systems. The term "optical communication" in this document is used broadly to encompass many uses of optical signals, including transmitting, sending, receiving, or carrying optical signals for purposes including voice communication, data transfer, and other purposes.

The PCB 200 may have a structural core 202. This structural core 202 provides a rigid support to which other parts of the PCB 200 may be applied or electronic devices may be attached. The structural core 202 in this case has four core structural layers 204, 206, 208, 210, although in other embodiments other numbers of layers may make up the structural core 202, or the PCB 200 may lack a separate structural core 202. In an embodiment, the core structural layers 204, 206, 208, 210 are each a composite material that includes fiberglass and a resin, although other materials may also be used in addition to, or in place of the fiberglass and resin. In an embodiment of such a fiberglass/resin structural core 202, the core is made by stacking prepreg fiberglass plies (fiberglass fabric impregnated with resin) together. The stacked plies are then pressed and cured. The core structural layers 204, 206, 208, 210 are pressed together and cured to form the structural core 202 in an embodiment.

Above the top core structural layer 204 may be a first top layer of conductive traces 212. These conductive traces 212 may provide electronic connections to electronic devices attached to the PCB 200. The conductive traces 212 may provide power or ground, or may allow electronic devices to communicate through use of electronic signals conducted by the traces 212. The first layer of conductive traces 212 may be covered by a structural layer 214. This structural layer 214 may be applied on top of the first layer of conductive traces 212 and cured. This process may allow the structural layer 214 to fill in gaps between the traces 212 and adhere to the top layer 204 of the core 202 as well as to the traces 212 themselves. On top of the structural layer 214 may be a second top layer of conductive traces 216. These traces 216 may also provide power or ground, or may allow electronic devices to communicate. The structural layer 214 separates the first and second top layers of conductive traces 212, 216, and insulates the traces 212, 216 from each other.

Similarly, below the bottom core structural layer 210 may be a first bottom layer of conductive traces 218, a structural layer 220, and a second bottom layer of conductive traces 222. Like the top layers of conductive traces 212, 216, the bottom layers of conductive traces 218, 220 may provide power or ground, or may allow electronic devices to communicate. The structural layer 220 separates the first and second bottom layers of conductive traces 218, 220, and insulates the traces 218, 220 from each other.

The PCB 200 may also have one or more optical fibers 224 embedded within the PCB 200. In the illustrated embodiment, an optical fiber 224 is embedded in the PCB 200 between two of the core structural layers 204, 206. One or more optical fibers 224 may be embedded between core structural layers 204, 206, 208, 210, within a single core structural layer 204, 206, 208, 210, between other layers such as between a layer of conductive traces 212 and a structural layer 214, or within other layers, such as within structural layer 220. In an embodiment, multiple optical fibers 224 are embedded within the PCB 200 in a predetermined pattern with known spacings between the optical fibers.

In the illustrated embodiment, a first device 226 and a second device 228 are attached to the PCB 200. These devices 226, 228 may be connected to conductive traces 212, 216 to provide power and ground connections, for example. The electronic devices 226, 228 may also be connected to conductive traces 212, 216 so that the traces 212, 216 provide some communication. However, the devices 226, 228 may be capable of communicating optically. In an embodiment, the devices 226, 228 may be electronic-to-optical and/or optical-to-electronic converters for sending and receiving optical information and converting it for use by electronic components. In another embodiment, the devices 226, 228 may be primarily electronic devices capable of optical communication through internal electronic-to-optical and/or optical-to-electronic converters. In other embodiments, the devices 226, 228 may be other types of devices or components.

In an embodiment the first device 226 may be connected to a first optical via 230. The first optical via 230 may allow transmission of light to or from the first device 226 to a first optical redirector 234. The first optical via 230 may be a tube that directs light to or from the first optical redirector 234, may be a well defined by sidewalls of the layers 214, 204 through which it passes, or may be another structure that allows light to travel between the surface of the PCB 200 to the optical redirector 234. The first optical redirector 234 redirects light traveling down the first optical via 230 so that the light is directed into the optical fiber 224, and redirects light received from the optical fiber 224 so that the light travels up the first optical via 230. The first optical redirector 234 may be a mirror, a prism, or another device that is capable of redirecting light. The optical fiber 224 provides a pathway for light to travel through the PCB 200. A second optical redirector 236 redirects light received from the optical fiber 224 so that the light travels up a second optical via 232 or redirects light traveling down the second optical via 232 so that the light is directed into the optical fiber 224. Like the first optical redirector 230, the second optical redirector 236 may be a mirror, a prism, or another device that is capable of redirecting light. A second device 228 may be connected to the second optical via 232, which allows transmission of light to or from the second device 228. Like the first optical via 230, the second optical via 232 may be a tube that directs light to or from the second optical redirector 236, may be a well defined by sidewalls of the layers 214, 204 through which it passes, or may be another structure that allows light to travel between the surface of the PCB 200 to the optical redirector 236.

As an example of the system in action, the first device 226 communicates optically with the second device 228. The first device 226 generates an optical signal, in the form of light, and outputs this light to the first optical via 230. The light travels down the first optical via 230 to the first optical redirector 230. The first optical redirector 230 redirects the light so the light is coupled into the optical fiber 224. The light travels along the optical fiber to the second optical redirector 236. The second optical redirector 236 redirects the light received from the optical fiber 224 so that it travels up the second optical via 232. The light that travels up the second optical via 232 is received by the second device 228. This allows the first and second devices 226, 228 to communicate optically, which allows for transfer of data at much higher rates than electronic communication.

It is readily seen that the system illustrated in FIG. 2 allows communication in both directions: from the first device 226 to the second device 228 (as described above) as well as from the second device 228 to the first device 226. Also, the optical fiber 224 or fibers embedded in the PCB 200 may be used in many ways for communications. For example, a first device 226 attached to the PCB 200 may communicate with a separate device (not shown) that is not attached to the PCB 200. In such a case the first device 226 may be connected to an optical fiber 224 as shown in FIG. 2, but the separate device with which the first device 226 communicates may be optically connected by another scheme. The light from the first device 226 may travel along the optical fiber 224 to a boundary of the PCB 200, where another optical device or devices, such as a wave guide or another device, couples the light with the separate device. In another example, a device 226 may be connected to more than one optical fiber 224 to communicate with more than one other component.

As a simplified summary, the PCB 200 may be considered to have one or more optical fibers 224 embedded in a matrix material. In the embodiment illustrated in FIG. 2, the matrix material includes several layers 204, 206, 208, 210, 212, 214, 216, 218, 220, 222, and the optical fibers 224 are embedded between two different layers. The optical fibers 224 may also be embedded within a single layer. In another embodiment, the PCB 200 may include more or fewer layers that are considered as the matrix material, or may have one homogeneous piece of matrix material in which the optical fibers 224 are embedded. The PCB 200 may also include additional structures as part of the matrix material. Having optical fibers 224 within matrix material may allow optical communication through the PCB 200.

Embedding Optical Fibers in a Printed Circuit Board

FIGS. 3a through 3i illustrate a first embodiment of how optical fibers may be embedded in a PCB 200. In this first embodiment, the optical fibers are embedded between layers of a PCB 200.

Figure 3A:
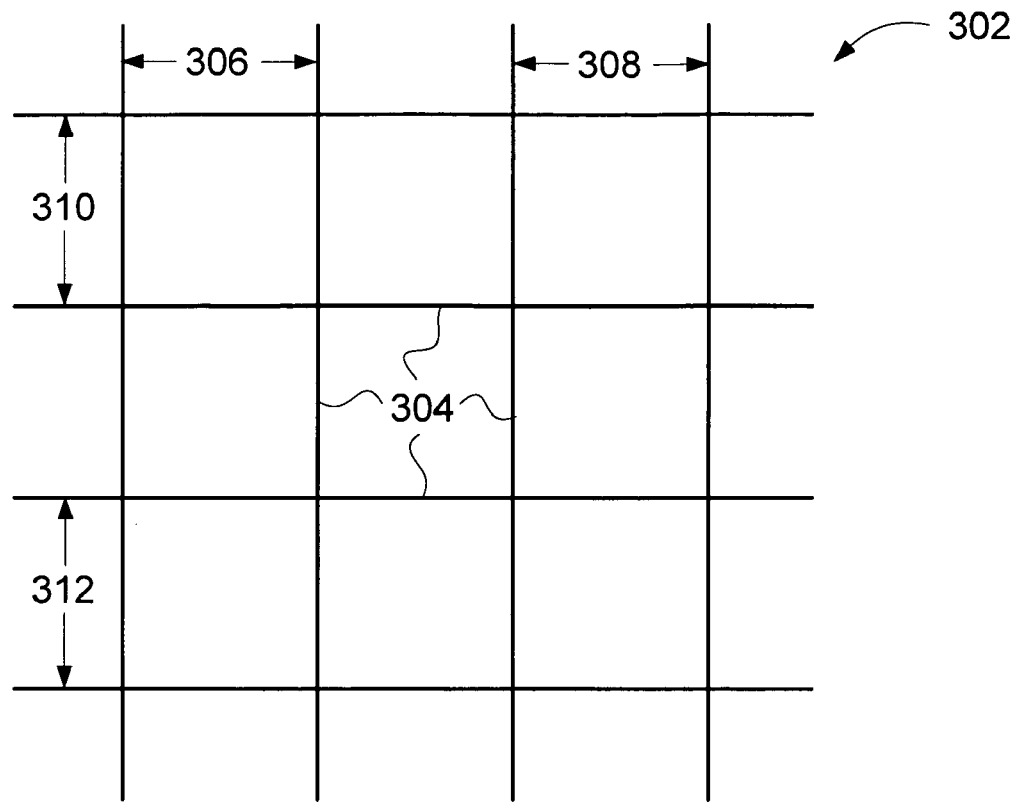
FIGS. 3a through 3i illustrate a first embodiment of how optical fibers are embedded in a PCB.

FIG. 3a is a top view of an embodiment of an optical fiber pattern 302 that may be embedded in the PCB 200 between layers. The optical fiber pattern 302 may include multiple optical fibers 304. As illustrated, the optical fibers 304 make up a pattern 302 that is a grid, with equal horizontal spacings 306, 308 and vertical spacings 310, 312 between optical fibers 304. Grid patterns 302 may also have differing horizontal spacings, such as if spacing 306 were different from spacing 308, and/or differing vertical spacings, such as if spacing 310 were different from spacing 312. Many different spacing schemes and patterns 302 may be used, including non-grid patterns 302 in other embodiments. For example, a single optical fiber 304 may be the entire pattern 302, or the pattern 302 may even be optical fibers 304 randomly distributed. In another embodiment, the optical fibers 304 are positioned in a pattern 302 to form a point to point optical communication network for a particular arrangement of components to be coupled to the PCB 200. A file such as a Gerber file may be generated, which may provide the information necessary to correctly place the optical fibers 304 to allow components coupled to the PCB 200 to use the optical fibers 304 for optical communication.

In some embodiments, the patterns 302, including any spacings 306, 308, 310, 312 between optical fibers 304, may be preselected and known so that the locations of optical fibers 304 in relation to each other are known. In an embodiment, the spacings 306, 308, 310,312 between optical fibers 304 are chosen based on the spacings of devices that will be attached to the PCB 200. For example, the spacings may be chosen to be 0.75 mm, 1 mm, or 1.27 mm in some embodiments.

Figure 3B:
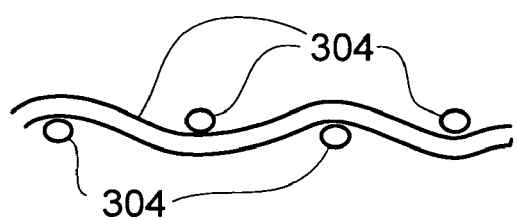

FIG. 3b is a cross sectional side view of the pattern 302 of FIG. 3a. In the embodiment illustrated in FIG. 3b, horizontal optical fibers 304 are woven to alternate passing above and below vertical optical fibers 304, and vertical optical fibers 304 alternate passing above and below horizontal optical fibers 304. In other embodiments, the optical fibers 304 may be placed differently. All horizontal fibers 304 may be above all vertical fibers 304 rather than woven, or a horizontal fiber 304 may pass above two vertical fibers 304 then below one vertical fiber 304, or other placement schemes may be used.

Figure 3C:
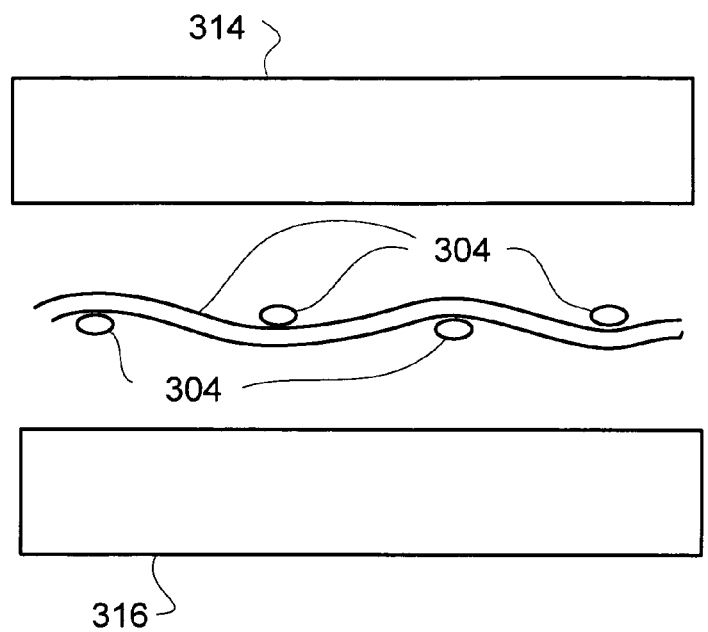
Figure 3D:
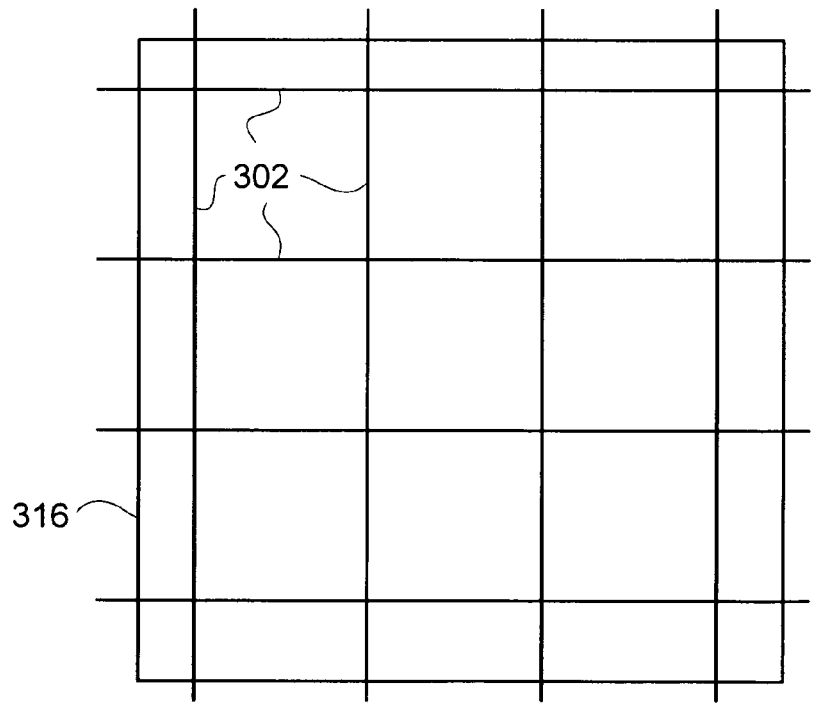

FIGS. 3c and 3d illustrate the optical fiber pattern 302 in relation to structural layers 314, 316 prior to the optical fiber pattern 302 being embedded in the PCB 200. FIG. 3c is a cross sectional view that illustrates an embodiment where the optical fibers 304 in the optical fiber pattern 302 are to be embedded in the PCB 200 by being placed between two structural layers 314, 316 or other layers. The layers 314, 316 may be two structural layers, such as layers structural layers 204, and 206 illustrated in FIG. 2, or may be other layers. The optical fiber pattern 302 may be positioned between the two layers 314, 316, prior to the layers 314, 316 being coupled together. "Coupled together" means the layers 314, 316 and the optical fibers 304 are stacked then pressed together and cured in one embodiment where the layers include fiberglass and resin. FIG. 3d is a top view that illustrates the optical fiber pattern 302 positioned above the bottom layer 316 prior to the two layers 314, 316 being coupled together. In one alternative embodiment, the optical fiber pattern 302 may be formed on the surface of a prepreg layer, such as layer 316, rather than the more discrete optical fiber pattern 302 layer shown in the stack of FIG. 3c.

Figure 3E:
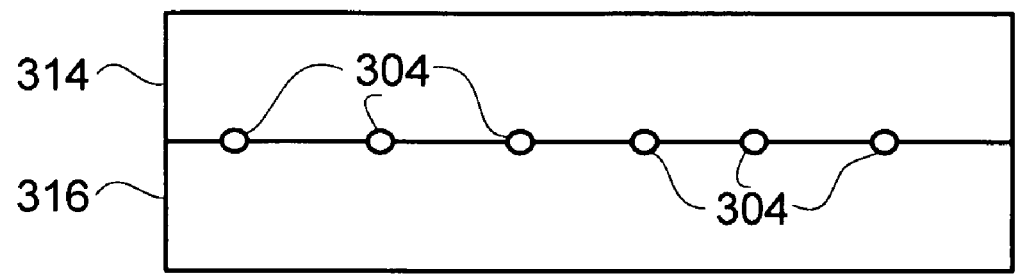

FIG. 3e is a side cross sectional view that illustrates the optical fibers 304 in the optical fiber pattern 302 between the two layers 314, 316 after the layers 314, 316 have been coupled together. For clarity, in FIG. 3e the cross section is taken so that only optical fibers 304 normal to the plane of the page are shown. In an embodiment where the layers 314, 316 are core structural layers, such as layers 204, and 206 illustrated in FIG. 2, and are made of materials including fiberglass and resin, the layers 314, 316 may be pressed together and cured with the optical fiber pattern 302 between them. This may result in the optical fibers 304 of the optical fiber pattern 302 being located between, or "sandwiched" by, the two layers 314, 316 after the two layers 314, 316 are coupled together. The layers 314, 316 may flow around the optical fibers 304 in the curing process to make contact and adhere with each other as well as the optical fibers 304. In an embodiment, the locations of the optical fibers 304 within the optical fiber pattern 302 may be known, and the thicknesses of the layers 314, 316 may be known, so that the locations of the optical fibers 304 as illustrated in FIG. 3e may be known and may be accessed by drilling or other methods. In an embodiment, the optical fibers 304 may shift location slightly as the layers 314, 316 are coupled together, but the drilling or other method used to create a hole to access the fibers 304 creates holes large enough that the optical fibers 304 may still be accessed using knowledge of their position prior to being embedded in the PCB 200 between the two layers 314, 316.

Figure 3F:
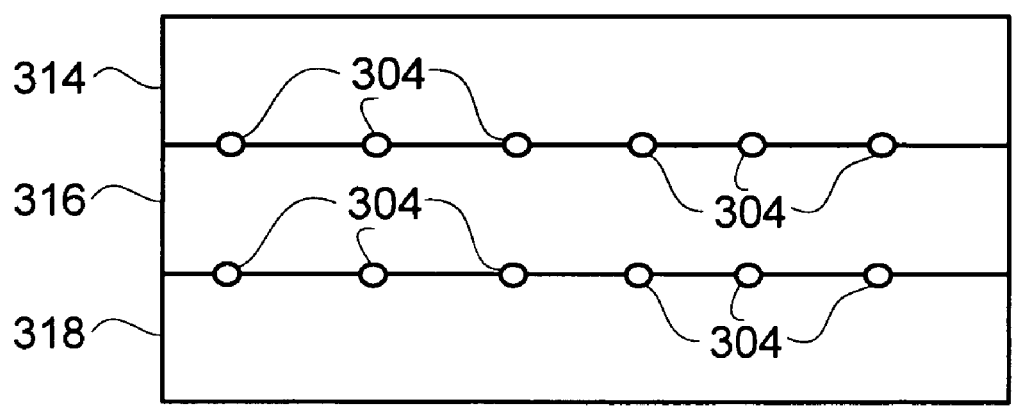

FIG. 3f is a side cross sectional view that illustrates two separate optical fiber patterns 302 with optical fibers 304 embedded between three layers 314, 316, 318. There may be a first optical fiber pattern 302 with optical fibers 304 embedded between layers 314 and 316, and a second optical fiber pattern 302 with optical fibers embedded between layers 316 and 318. Embedding the optical fibers 304 between layers 316 and 318 may be done similarly to embedding optical fibers 304 between layers 314 and 316, as described above. FIG. 3f shows that more than one optical fiber pattern 302 may be embedded in the PCB 200, at multiple different levels.

Figure 3G:
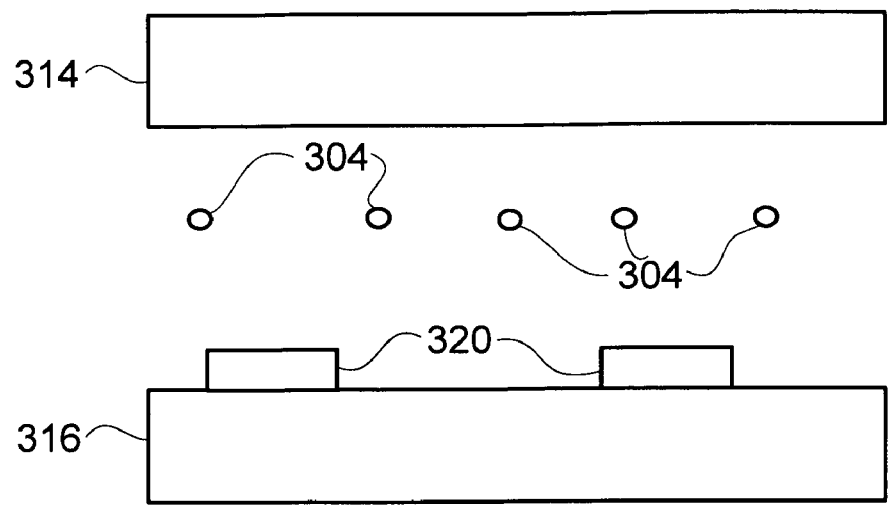
Figure 3H:
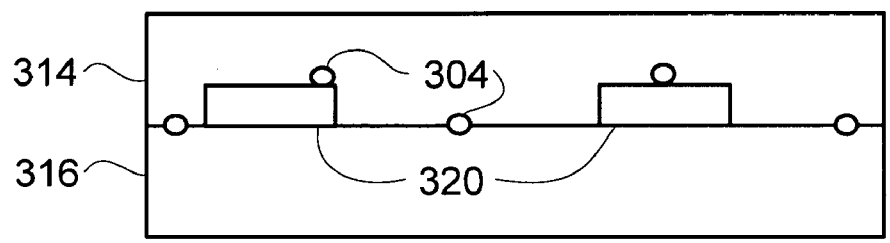

FIGS. 3g and 3h are side cross sectional views that illustrate how optical fibers 304 may be embedded between a layer 314, which may be a structural layer, and a layer of conductive traces 320, such as layer 212 in FIG. 2. FIG. 3g illustrates the layer of conductive traces 320 on layer 316, optical fibers 304 in a pattern 302 positioned above the conductive traces 320, and a layer 314, which may be a structural layer, above the optical fibers 304 prior to coupling the fibers 304 and layers 314, 316, 320 together. FIG. 3h illustrates the optical fibers 304 and layers 314, 316, 320 after they have been coupled together. In the illustrated embodiment, layer 314 flows around the conductive traces 320 during the curing process to meet and adhere with layer 316 as well as the traces 320. The optical fibers 304 above the traces 320 in FIG. 3g remain above the traces 320 after the fibers 304 and layers 314, 316, 320 are coupled together. Thus, the optical fibers 304 may be no longer substantially located in a plane between two layers, such as layer 314 and layer 316; rather, the optical fibers 304 above the traces 320 may be located at different heights than other optical fibers 304.

Figure 3I:
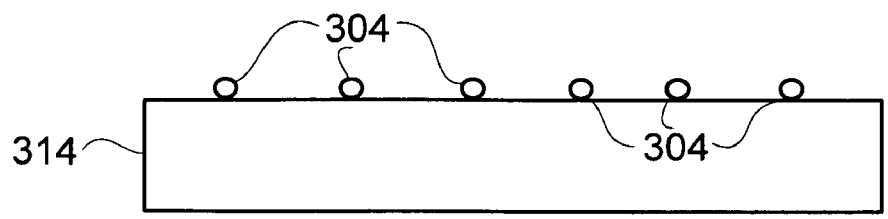

FIG. 3i is a side cross sectional view that illustrates a slight variation of embedding a pattern of optical fibers 302 between two layers. In FIG. 3i, the optical fibers 304 are adhered to the top of a layer 314. The layer 314 with the adhered optical fibers 304 may be stacked with another layer above and pressed together to result in the optical fibers being between two layers. The layer 314 may also be an external layer of the PCB 200 to result in the optical fibers remaining exposed on the surface of the PCB 200.

As a simplified summary, the PCB 200 may be considered to have one or more integrated optical fibers 304 embedded in a matrix material. In the embodiment illustrated in FIGS. 3a through 3h, the matrix material includes two or more layers, such as layers 314, 316, 318, 320, and the optical fibers 304 are embedded between two different layers. In such an embodiment, the two or more layers may be considered to be the matrix material in which the optical fibers 304 are embedded. The PCB 200 may also include additional structures as part of the matrix material. Having optical fibers 304 within matrix material that makes up the PCB 200 may allow optical communication through the PCB 200. In FIG. 3i, the optical fibers 304 are adhered to matrix material. In such cases, the optical fiber 304 may be considered integrated with the matrix material in the PCB 200, since the optical fibers 304 are a part of the PCB 200 to which components will then be coupled.

FIGS. 4a through 4d illustrate a second embodiment of how optical fibers may be embedded in a PCB 200. In this second embodiment, the optical fibers are embedded within one or more layers, such as within layer 204, 206, 208, or 210, of a PCB 200.

Figure 4A:
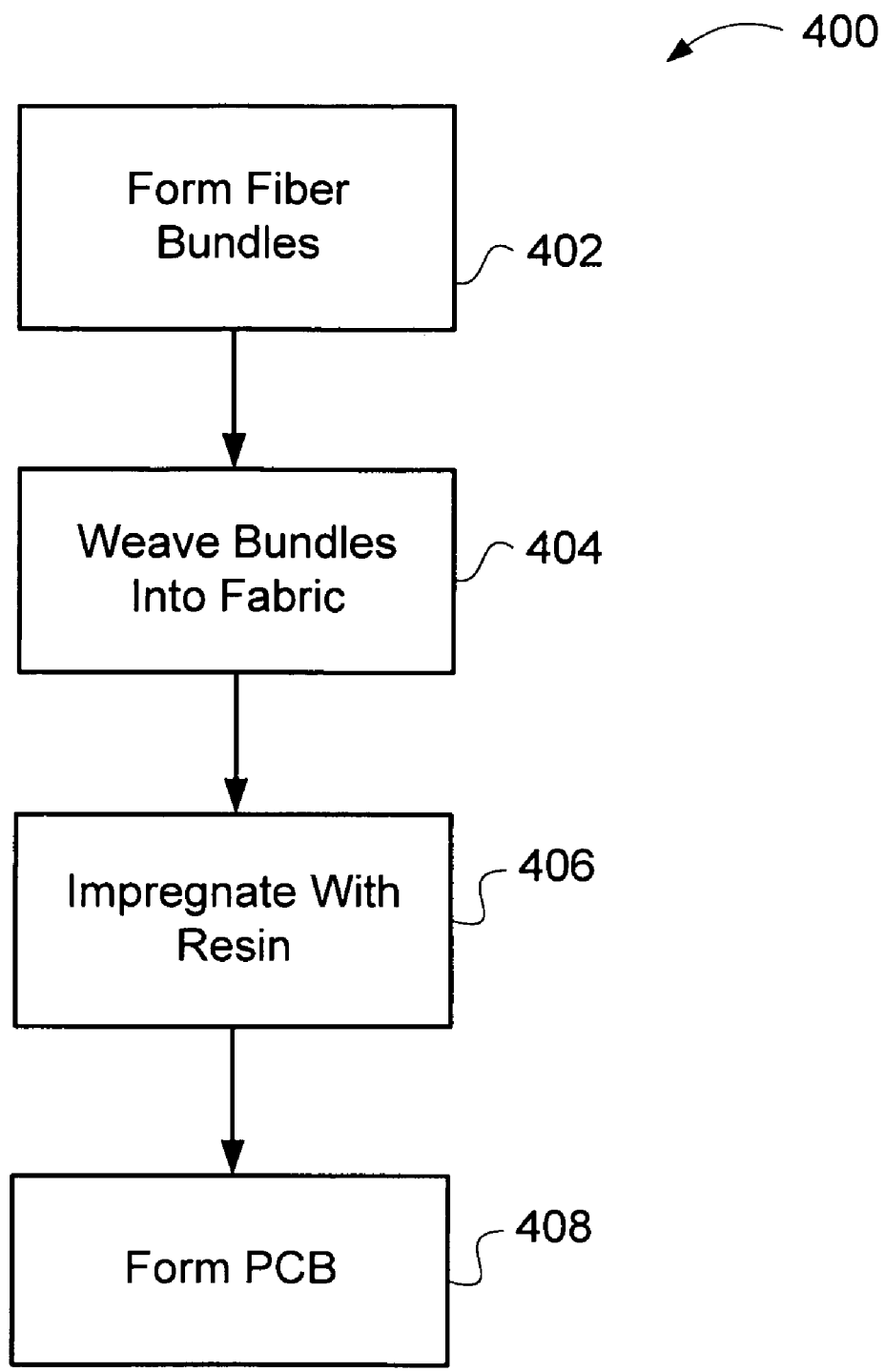
FIGS. 4a through 4d illustrate a second embodiment of how optical fibers are embedded in a PCB.

FIG. 4a is a flow chart 400 that explains how a layer, such as 204, 206, 208, or 210, of a PCB 200 is made with optical fibers embedded within that layer. In the described embodiment, the PCB 200 is made out of fiberglass fibers, one or more optical fibers, and resin, although in other embodiments, other materials and methods could be used to make the PCB 200. The fiberglass fibers may be structural fibers that add strength to the PCB 200.

Figure 4B:
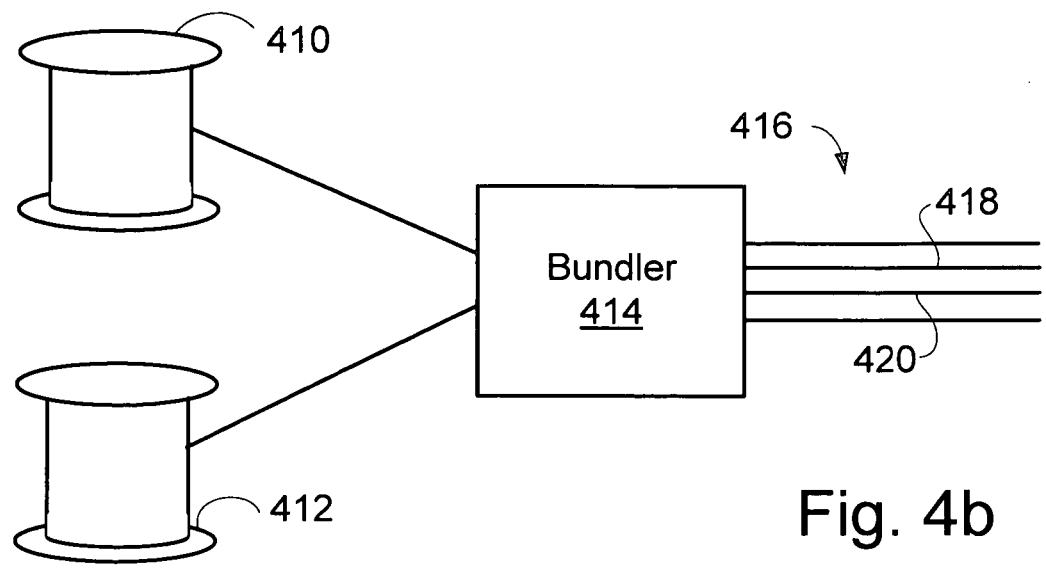

Fiber bundles may be formed 402 out of the fiberglass fibers and one or more optical fibers. Referring now to FIG. 4b, the bundling of fibers according to one embodiment is shown. There is a fiberglass fiber supply 410 and an optical fiber supply 412. A bundler 414 may receive the fiberglass fibers and optical fibers from the supplies 410, 412. This bundler 414 may combine multiple fibers into a group, or "bundle," 416 of fibers. In an embodiment, the fibers within the bundle 416 may be generally oriented substantially parallel with the bundle 416. The bundle 416 may include one or more optical fibers among the fiberglass fibers, such as optical fibers 418 and 420. In an embodiment, the location of optical fibers 418, 420 within the bundle 416 may be preselected and known, and the size of the bundle 416 is preselected and known. In an embodiment, the bundle 416 may have a substantially circular cross section with a diameter of about 0.005 inches.

Figure 4C:
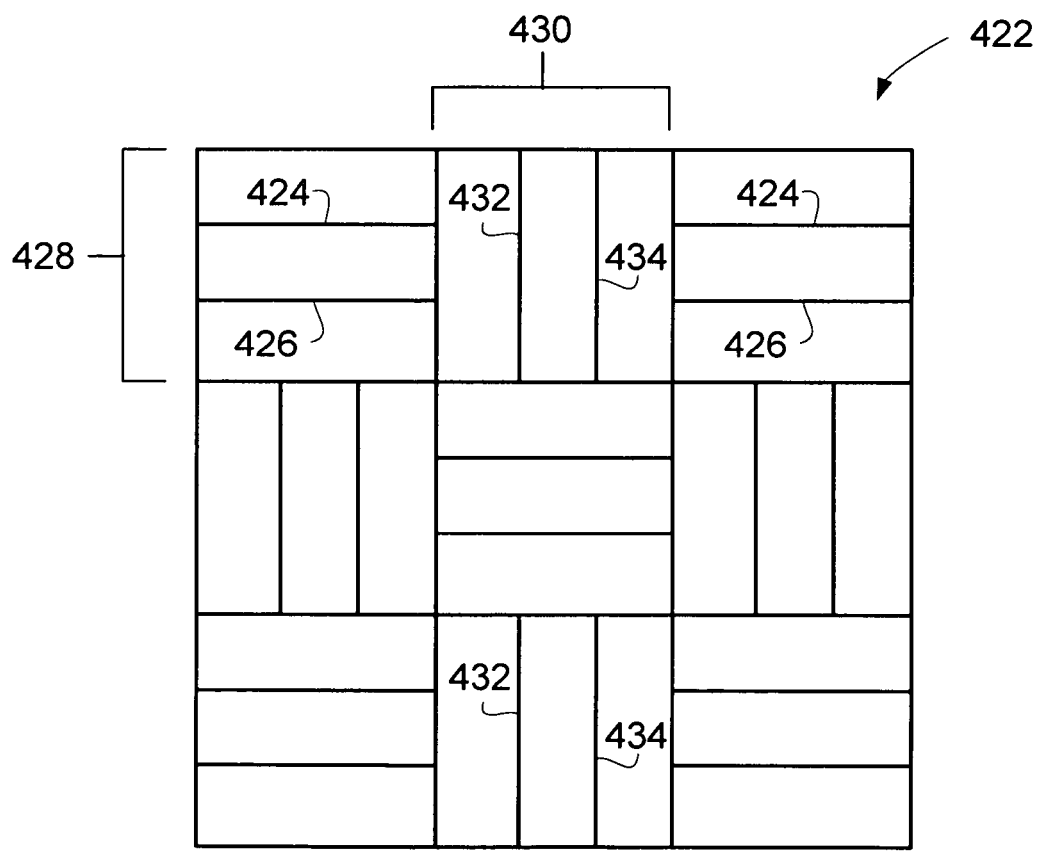

Returning to FIG. 4a, the bundles may then be woven 404 into a fabric. Referring now to FIG. 4c, a top view of a fabric 422 woven from the bundles 416 is illustrated. In the illustrated embodiment, each bundle 416 in a first (horizontal or vertical) is woven to alternate being above and below a bundle 416 in a second (the other of vertical and horizontal) direction, although in other embodiments different weaving methods may be used. For example, horizontal bundle 428, which includes optical fibers 424 and 426, starts above vertical bundles on the left side of FIG. 4c, is woven beneath vertical bundle 430 in the middle of FIG. 4c, then returns to being above the vertical bundle on the right side of FIG. 4c. Similarly, vertical bundle 430, which includes optical fibers 432 and 434, starts above horizontal bundle 428 at the top of FIG. 4c, is woven beneath the horizontal bundle in the middle of FIG. 4c, then returns to being above the horizontal bundle at the bottom of FIG. 4c. As shown in FIG. 4c, in some embodiments, the optical fibers within the fabric 422 substantially retain their relative position within a bundle within the fabric 422. For example, optical fiber 424 substantially retains its position within bundle 428 all the way from the left side to the right side of the fabric 422. As in some embodiments, both the size of the bundles 428, 430 within the fabric 422 and the location of the optical fibers 424, 426, 432, 434 within the bundles are known, the location of the optical fibers 424, 426, 432, 434 within the fabric 422 is also substantially known, so that the optical fibers 424, 426, 432, 434 may be accessed after being embedded in a PCB 200. In other embodiments, not every bundle 416 that is woven 404 into a fabric 422 may include an optical fiber.

Figure 4D:
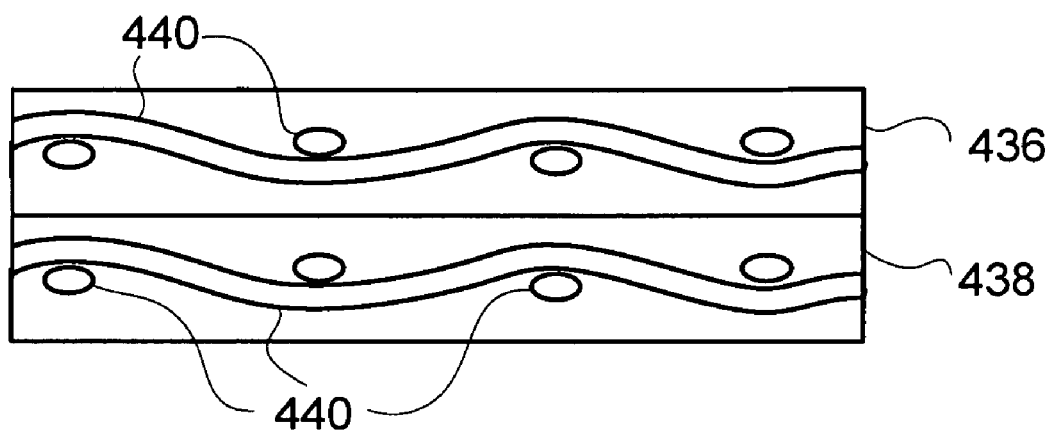

Returning to FIG. 4a, the fabric 422 may be impregnated with resin to form a composite material for a layer of the PCB 200. The PCB 200 may then be formed 408 with one or more of these layers. In an embodiment, this may be done by curing the resin. Referring to FIG. 4d, a cross sectional side view is shown that illustrates two coupled together layers 436, 438 with embedded optical fibers 440 that may be part of a PCB 200. The two layers 436, 438 may be two core structural layers 204, 206 of the PCB 200, for example, or they may be different layers of the PCB 200 or part of a different embodiment of a PCB 200. As shown in FIG. 4d, the optical fibers 440 within each layer 436, 438 are woven within the layer 436, 438 itself (for clarity, the fiberglass fibers are not shown). In an embodiment, two pieces of fabric 422 may be woven 404 from formed 402 bundles with optical fibers, impregnated 406 with resin, then pressed together and cured to form 408 a PCB 200 that includes the two-layer structure illustrated in FIG. 4d, where each layer 436, 438 includes embedded optical fibers 440. One, some or all of layers in a PCB 200 may include such embedded optical fibers, which may allow for high speed optical data communication.

As a simplified summary, the PCB 200 may be considered to have one or more integrated optical fibers 440 embedded in a matrix material. In the embodiment illustrated in FIGS. 4a through 4d, the matrix material includes one or more layers, such as layers 436 and/or 438, and the optical fibers 440 are embedded within a layer. In such an embodiment, the one or more layers may be to be the matrix material in which the optical fibers 440 are embedded. The PCB 200 may also include additional structures as part of the matrix material. Having optical fibers 440 within matrix material may allow optical communication through the PCB 200.

Figure 5:
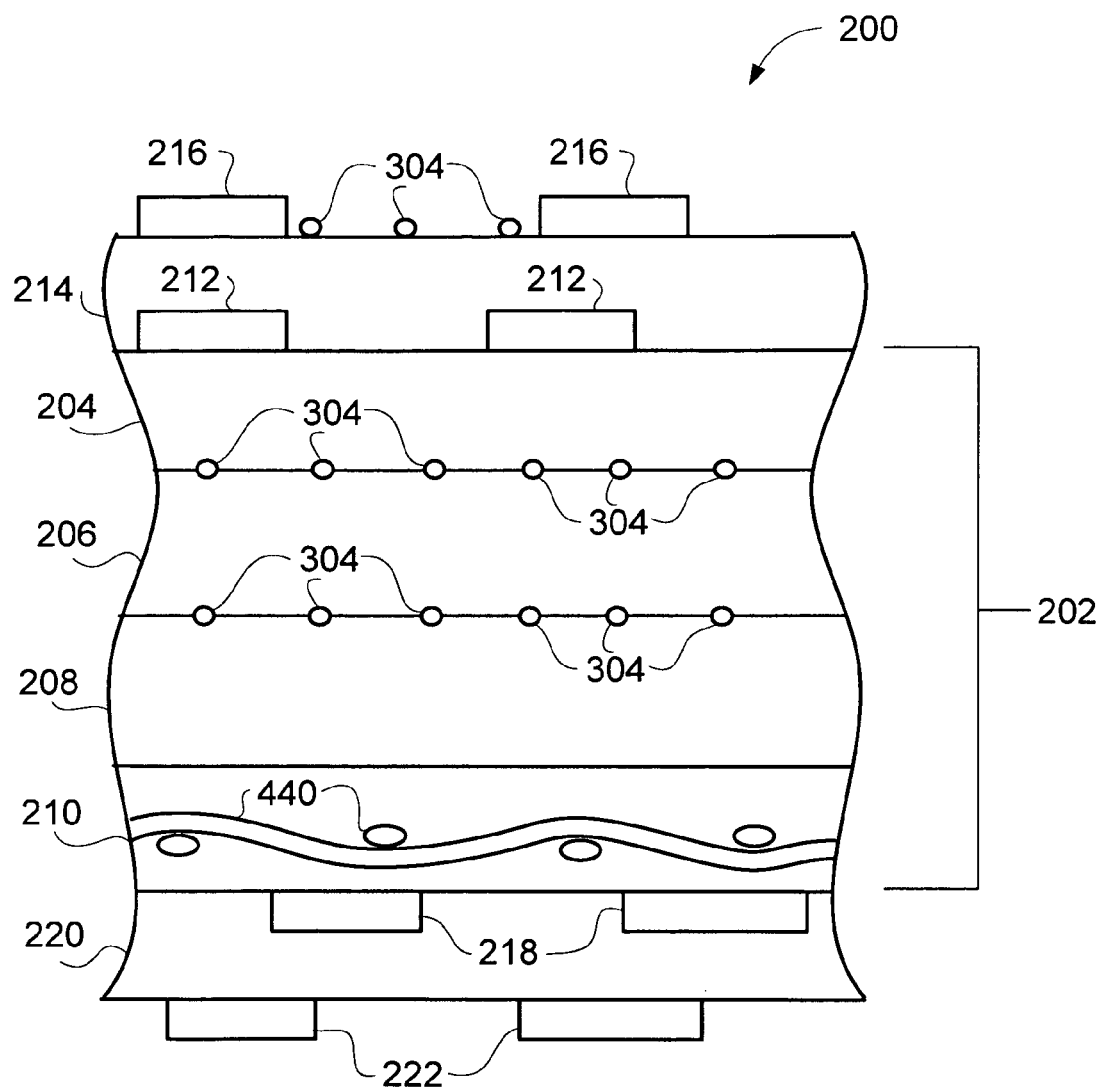
FIG. 5 is a cross-sectional side view showing various ways that optical fibers may be integrated in a PCB.

FIG. 5 is a side cross sectional view that illustrates the PCB 200 of FIG. 2 with some different ways optical fibers 304, 440 may be embedded, according to the two embodiments of embedding described above. In the illustrated embodiment, optical fibers 304 are embedded between layers in the structural core 202. There are optical fibers 304 between core structural layers 204 and 206 and between core structural layers 206 and 208, although in other embodiments, optical fibers 304 may be embedded between different layers. The locations of the optical fibers 304 may be substantially known in some embodiments. In one embodiment, the optical fibers 304 may be arranged in a grid pattern to allow their use for optical communications by many different arrangements of components on the PCB 200. In another embodiment, the optical fibers 304 may be arranged in a pattern 302 that is specific to create a point to point optical communications network for a particular arrangement of components on the PCB 200. Also, different PCBs 200 with different layer structures may have one or more optical fibers 304 embedded within their layers. There may also be optical fibers 304 integrated in the PCB 200 by being adhered to the top surface layer 214 of the PCB 200. These fibers 304 may be in a pattern 302 to create a specific point to point network, a grid pattern, or another pattern. They may be designed and placed on the layer 214 similarly to the design and placement of metal traces 216. Finally, there are optical fibers 440 embedded within a single layer 210 of the PCB 200. Any or all of these methods of embedding or integrating one or more optical fibers with a PCB 200 may be used to allow for high speed optical data communication. Other combinations of methods of integrating optical fibers beyond that illustrated in FIG. 5 may also be created.

Coupling Optical Signals To and From Embedded Optical Fiber

FIGS. 6a through 6i are cross sectional side views that illustrate one embodiment of how an optical fiber embedded in a PCB 200 is coupled to an optical signal source or destination, to allow use of the optical fiber within the PCB 200 for optical communications. In some embodiments, this may be done by making an optical via to allow light to reach the optical fiber from the surface of the PCB 200.

Figure 6A:
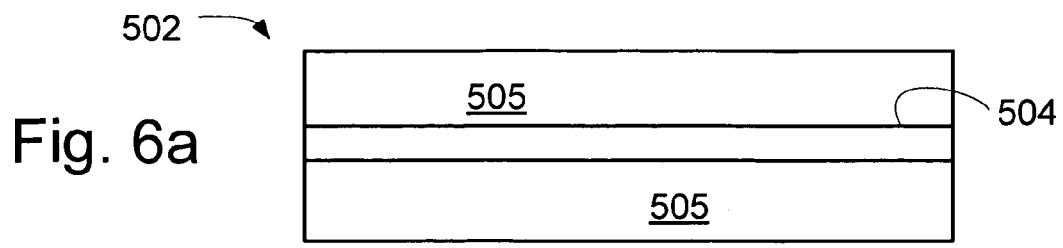
FIGS. 6a through 6i are cross sectional side views that illustrate how an optical fiber embedded in a PCB is coupled to an optical signal source or destination.

FIG. 6a is a cross sectional side view of a simplified illustration of a PCB 502 with an embedded optical fiber 504. For clarity, the simplified illustration of the PCB 502 only shows that an optical fiber 504 is embedded within matrix material 505 of the PCB 502, and does not show the various structures and layers that may make up the PCB 502 in various embodiments. The optical fiber 504 within the PCB 502 may be used by a device attached to the surface of the PCB 502 for optical communications. The matrix material 505 of the PCB 502 may be, for example, one or more layers of a fiberglass/resin composite, although other materials may also be used. If there are layers or discrete sections of multiple different materials that form the PCB 502, such as layers 204, 206, 208, 210, 212, 214, etc. of FIG. 2, all these materials, sections and layers may be considered the matrix material 505.

Figure 6B:
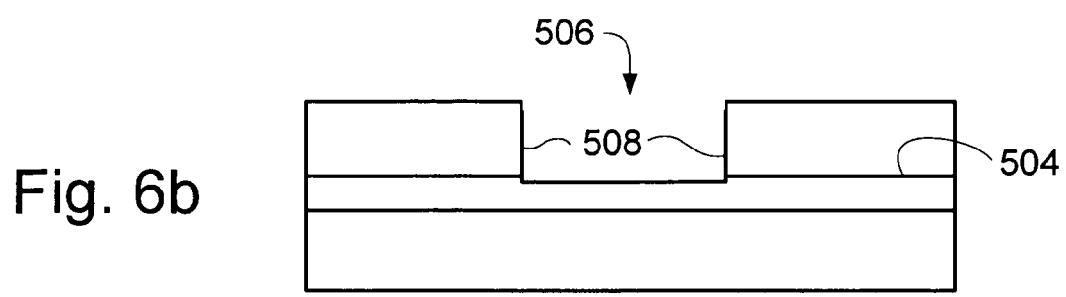

FIG. 6b is a cross sectional side view that illustrates the PCB 502 after a first well 506 is formed through the matrix material 505 to access the optical fiber 504. Side walls 508 of the matrix material 505 that extend from the surface of the PCB 502 may define sides of the first well 506.

In some embodiments of PCBs 502 with embedded optical fibers 504, the angle of the optical fiber 504 may not be parallel with the surface of the PCB 502, and the exact distance of the optical fiber 504 beneath the surface of the PCB 502 may not be known. In an embodiment, the angle may be up to 15 degrees away from parallel with the surface of the PCB 502, with the precise angle not being known. In an embodiment, the distance of the optical fiber 504 beneath the surface of the PCB 502 may be known to a margin of error of plus or minus 0.003 inches. In an embodiment, the distance of the optical fiber 504 beneath the surface of the PCB 502 may be known to a margin of error of plus or minus 0.001 inches. In other embodiments, the distance of the optical fiber 504 beneath the surface of the PCB 502 may be known to varying other degrees of precision. Also, the locations of the optical fibers 504 within the plane of the PCB 502 may not be precisely known. In an embodiment where the optical fibers 504 are part of a pattern 302, the PCB 502 may be tested to find one optical fiber 504, then the known spacings 306, 308, 310, 312 between optical fibers 504 may be used to determine the location of the other optical fibers 504. In an embodiment where the optical fibers 504 are part of a pattern 302, the locations of the optical fibers 504 may be known with a margin of error of plus or minus 0.003 inches. Similarly, if the optical fibers 504 are embedded within a layer, the locations of the optical fibers 504 may be known with a margin of error of plus or minus 0.003 inches in an embodiment, with the spacings between optical fibers 504 provided by the size of the bundles 416.

Thus, in some embodiments where the depth, location and angle of the optical fiber 504 are not exactly known, the first well 506 may extend down to reach the topmost surface of the optical fiber 504, may extend partially through the matrix 505 but not reach the optical fiber 504, or may extend into the optical fiber 504 so that the bottom of the first well 506 is below the top surface of the optical fiber 504 (illustrated in FIG. 6b).

The first well 506 may be created by multiple different methods. In an embodiment, the well may be formed by high power lasers. Lower power laser may be used to smooth the sidewalls 508 of the first well 506. Other methods, such as chemical etching, may also be used. In an embodiment, the diameter of the first well 506 may be significantly larger than the diameter of the optical fiber 504 so that the well 506 is more likely to reach the optical fiber 504 even if the precise location of the optical fiber 504 is not known. For example, the first well 506 may have a circular cross section that has a diameter twice as large as a diameter of the optical fiber 504 in an embodiment. In another embodiment, the first well 506 may have a substantially circular cross section with a diameter of approximately 0.010 inches. In another embodiment, the first well 506 may have a substantially circular cross section with a diameter greater than the margin of error of the known location of the optical fiber. In other embodiments, the first well 506 may be other sizes and have other, non-circular shapes.

Figure 6C:
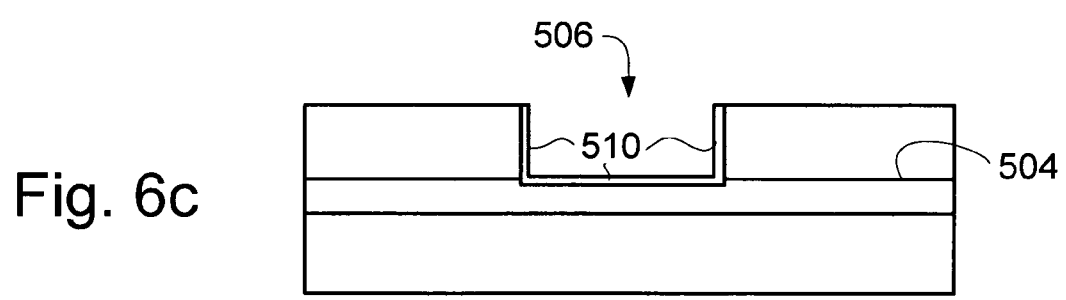

FIG. 6c is a cross sectional side view that illustrates the PCB 502 after a light blocking layer 510 has been deposited on the surfaces of the first well 506. In an embodiment, the light blocking layer 510 may prevent some or all of light traveling between the surface of the PCB 502 and the optical fiber 504 from diffusing or refracting into the matrix material 505 of the PCB 502. In another embodiment, the light blocking layer 510 may add structural reinforcement to the matrix material 505 that defines the side walls 508 of the first well 506. The light blocking layer 510 may be deposited through a plating or metallization method, or another method. The light blocking layer 510 may reflect some or all incident light, or prevent some or all incident light from passing through.

Figure 6D:
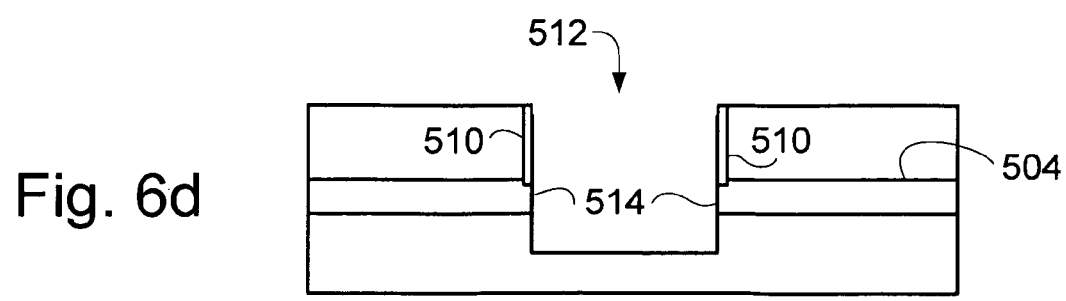

FIG. 6d is a cross sectional side view that illustrates the PCB 502 after a second well 512 is formed through the optical fiber 504. The second well 512 may expose the light transmissive surfaces 514 on the cross section of the optical fiber 504 so that light may be coupled into the optical fiber 504 from a source or coupled from the optical fiber 504 to a destination. This second well 512 may be thought of as a tube or an optical via to allow light to travel from the PCB 502 surface to the optical fiber 504. In an embodiment, the second well 512 may be created by multiple different methods. In an embodiment, the well 512 may be formed by high power lasers. Lower power laser may be used to smooth sidewalls of the second well 512. Other methods, such as chemical etching, may also be used to form the second well 512. The method used to create the second well 512 may leave the light transmissive surfaces 514 of the optical fiber 504 sufficiently smooth for coupling light to and from the optical fiber. However, in some embodiments further smoothing is performed. This may be done by a polishing slurry, such as alumina or diamond, a polishing tool, or through other methods.

In another embodiment, only one well that extends from the surface of the PCB 502 to the expose the light transmissive surfaces 514 of the optical fiber 504 may be formed. In such embodiments, a separate tube may be formed extending at least partially from the surface of the PCB 502 to the optical fiber 504 to prevent light from diffusing or refracting into the matrix material 505. Alternately, a mask may cover the light transmissive surfaces 514 of the optical fiber 504 so that a light blocking layer 510 may be deposited to prevent light from diffusing or refracting into the matrix material 505, while leaving the transmissive surfaces 514 of the optical fiber 504 free from the light blocking layer 510. In yet another embodiment, no separate tube or light blocking layer 510 may be used; sufficient light reaches the optical fiber 504 without such structures.

Figure 6E:
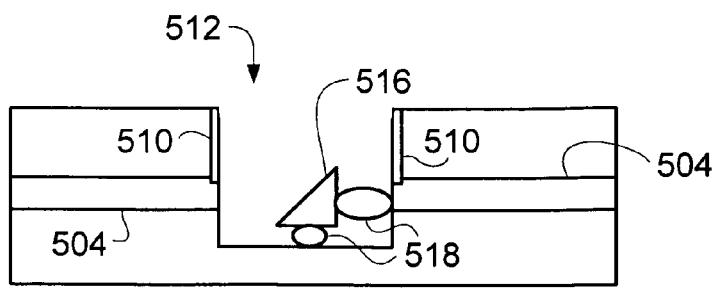

FIG. 6e is a cross sectional side view that illustrates the PCB 502 after a light redirector 516 is inserted into the second well 512. In an embodiment, glue 518 may hold the light redirector 516 in place. The glue 518 may not be cured yet at this point in an embodiment, and may be reworked so that the position of the light redirector 516 (also known as an "optical redirector") may be altered. In other embodiments, different attachment materials 518 may be used to hold the light redirector 516 in place. In some embodiments, these attachment materials 518 may hold the light redirector 516 in place as desired, but may be reworkable or alterable through the application or force or other means so that the position of the light redirector 516 may be altered. The light redirector 516 may be a mirror, a prism, or another device that redirects light.

Figure 6F:
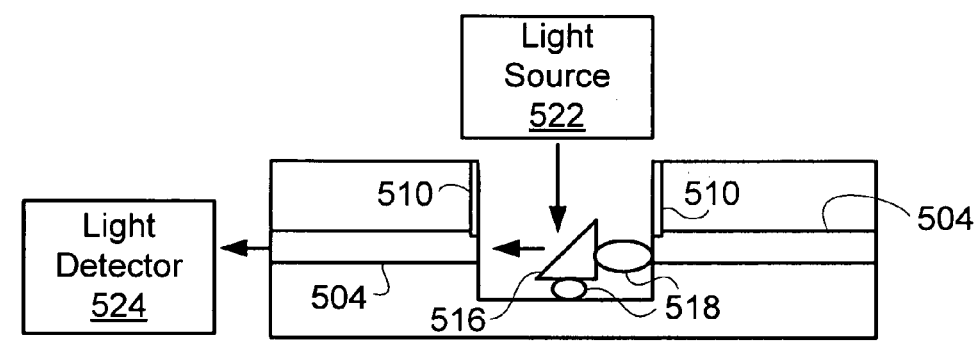

FIG. 6f is a cross sectional side view that illustrates how the angle and depth of the light redirector 516 may be positioned to correctly couple light to and from the optical fiber 504. In the illustrated embodiment, a light source 522 directs light toward the light redirector 516. The light redirector 516 redirects the light into the optical fiber 504, which outputs the light to a light detector 524. Feedback from the light detector 524 may be used to determine whether enough (or any) light is being redirected from the light source 522 into the optical fiber 504 by the light redirector 516. If not enough light is being redirected into the optical fiber 504, the position and angle of the light redirector 516 may be changed. Thus, by monitoring the light received by the light detector 524 and adjusting the light redirector 516 accordingly, the light redirector 516 may be correctly positioned. In some embodiments, the glue 518 may not have not cured before the light redirector 516 is correctly positioned, so that the light redirector's 516 position may be altered. After the light redirector 516 is correctly positioned, the glue 518 or other attachment material 518 is cured or set to keep the light redirector 516 in the correct position in an embodiment. Other methods for positioning the light redirector 516 may also be used. For example, the light detector 524 may be positioned adjacent the light source 522 at the top of the second well 512. The light detector 524 would then detect light that has been reflected and not coupled into the optical fiber 504. More light coupled into the optical fiber 504 means less reflected light. The light redirector 516 would be adjusted until a satisfactorily small amount of light is detected by the light detector 524.

Figure 6G:
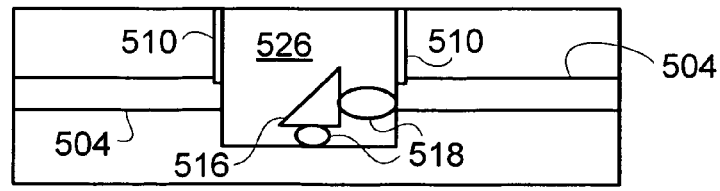

FIG. 6g is a cross sectional side view that illustrates the PCB 502 after the second well 512 is filled with an optically neutral material 526. This optically neutral material 526 may allow most or all of the light to pass through. The material 526 may also prevent the light redirector 516 from being damaged or repositioned, and may add structural support to the PCB 502. In embodiments where the attachment material 518 is not set in place to prevent further adjustment of the position of the light redirector 516, the optically neutral material 526 may be used to hold the light redirector 516 in place.

Figure 6H:
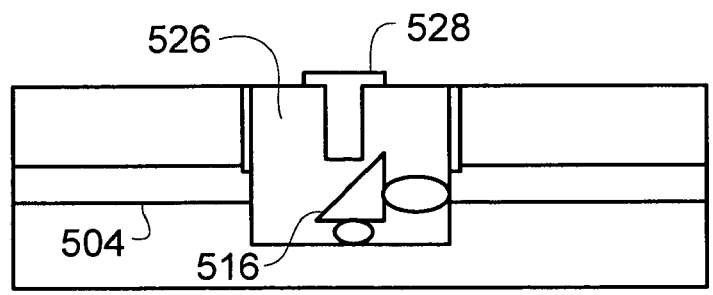

FIG. 6h is a cross sectional side view that illustrates the PCB 502 after a light guide 528 has been added. The light guide 528 may help direct light between the light redirector 516 and the surface of the PCB 502. In an embodiment, a hole may be formed in the optically neutral material 526. The light guide 528 may then be inserted into the hole. Optionally, the side walls of the hole may be coated with a material to form the light guide 528 rather than have a light guide 528 inserted into the hole. In other embodiments, the light guide 528 may be ommitted.

Thus, an optical via has been formed. The optical via may allow light to travel from the surface of the PCB 502 to the optical fiber 504 or optical redirector 516. The optical via may simply be a hole, such as the second well 512, or it may be filled with an optically neutral material 526, such as seen in FIG. 6g, or it may include a light guide 528, such as seen in FIG. 6h, or may take other forms with other structures.

Figure 6I:
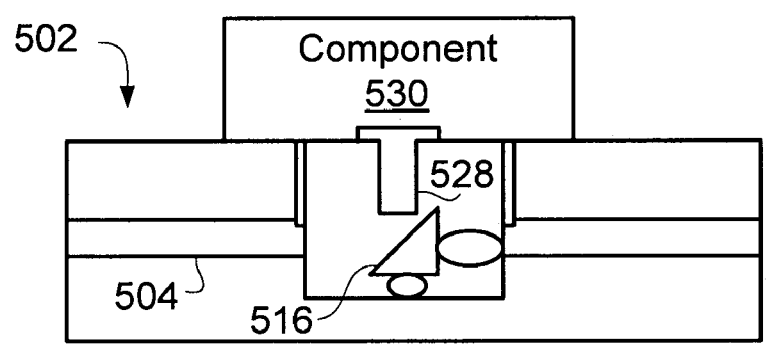

FIG. 6i is a cross sectional side view that illustrates the PCB 502 with an attached optical component 530. The optical component 530 may be an optical device, an electronic device with a module that performs electronic-to-optical and/or optical-to-electronic conversions, a component 530 that couples light to a device that is not attached to the PCB 502, or another type of component 530. Thus the component 530 may use the optical fiber 504 for optical communications. When the component 530 transmits an optical signal, the signal may travel from the component 530 to the light redirector 516 (possibly aided by the light guide 528 in some embodiments). The light redirector 516 may couple the light into the optical fiber 504, along which the light may travel to a destination. Similarly, when the component 530 receives an optical data signal, the signal may travel along the optical fiber 504 to the light redirector 516. The light redirector 516 may redirect the signal so it travels up the optical via to the component 530 (possibly aided by the light guide 528 in some embodiments). The PCB 502 with embedded optical fibers 504 may allow components 530 to optically transfer data at high speeds.

Although the invention is described herein with reference to specific embodiments, many modifications will readily occur to those of ordinary skill in the art. Further, the foregoing description of embodiments of the invention and the claims following include terms, such as left, right, over, under, upper, lower, first, second, etc. that are used for descriptive purposes only and are not to be construed as limiting. The embodiments of a device or article described herein can be manufactured, used, or shipped in a number of positions and orientations. Accordingly, all such variations and modifications are included within the intended scope of the invention as defined by the following claims.

We claim:

1. A method, comprising:
   forming an optical via in a printed circuit board to access an optical pathway through the printed circuit board, wherein forming an optical via comprises forming a first well in matrix material of the printed circuit board and wherein forming an optical via further comprise forming a light blocking layer on at least part of side walls of the first well to prevent at least some light from entering the matrix material of the printed circuit board as the light travels along the optical via;
   placing an optical redirector within the optical via; and
   adjusting the optical redirector to redirect light directed into the optical via so that the light is coupled into the optical pathway.

2. The method of claim 1, further comprising depositing optically neutral material within the optical via and around the optical redirector.

3. The method of claim 1, wherein forming an optical via comprises:
   forming a second well in matrix material of the printed circuit board, the second well having a depth greater than the first well and exposing light transmissive surfaces of the optical pathway.

4. The method of claim 1, wherein when the optical redirector is placed within the optical via it is attached to the printed circuit board with an adjustable attachment material.

5. The method of claim 4 wherein adjusting the optical redirector comprises:
   directing light from a source into the optical via to the light redirector;

redirecting, by the optical redirector, the light from the source;

detecting, with a light detector, light from the source that has traveled along the optical pathway after being redirected by the optical redirector;

measuring the detected light; and changing the position of the optical redirector.

6. The method of claim 1 wherein adjusting the optical redirector comprises reworking glue that is not cured yet between the optical redirector and the optical via.

7. The method of claim 1 wherein adjusting the optical redirector comprises applying a force to a material holding the redirector to the optical via.

8. The method of claim 1 wherein adjusting the optical redirector comprises using feedback from light directed by the optical redirector and detected in the optical pathway.

9. The method of claim 8 further comprising changing the position or angle of the redirector based on the feedback.

10. The method of claim 1 wherein the optical pathway through the printed circuit board comprises an optical fiber embedded in the printed circuit board.

11. The method of claim 1 wherein the optical pathway through the printed circuit board consists substantially of an optical fiber embedded in the printed circuit board.

12. A method, comprising:

forming an optical via in a printed circuit board to access an optical pathway through the printed circuit board;

placing an optical redirector within the optical via;

adjusting the optical redirector to redirect light directed into the optical via so that the light is coupled into the optical pathway;

depositing optically neutral material within the optical via and around the optical redirector; and forming a light guide to direct light through the optically neutral material along the optical via.

13. The method of claim 12 wherein the optical pathway through the printed circuit board comprises an optical fiber embedded in the printed circuit board.

14. The method of claim 12 wherein the optical pathway through the printed circuit board consists substantially of an optical fiber embedded in the printed circuit board.

15. A method, comprising:

forming an optical via in a printed circuit board to access an optical pathway through the printed circuit board;

placing an optical redirector within the optical via; and adjusting the optical redirector to redirect light directed into the optical via so that the light is coupled into the optical pathway, wherein adjusting the optical redirector comprises changing the position of the optical redirector.

16. The method of claim 15 wherein the optical pathway through the printed circuit board comprises an optical fiber embedded in the printed circuit board.

17. The method of claim 15 wherein the optical pathway through the printed circuit board consists substantially of an optical fiber embedded in the printed circuit board.

* * * * *